United States Patent [19]
Miyazono

[11] Patent Number: 5,383,203
[45] Date of Patent: Jan. 17, 1995

[54] COMPACT DEVICE FOR CORRECTING A HEADER ERROR IN ATM CELLS

[75] Inventor: Takashi Miyazono, Tokyo, Japan

[73] Assignee: NEC Corporation, Japan

[21] Appl. No.: 880,252

[22] Filed: May 8, 1992

[30] Foreign Application Priority Data

May 10, 1991 [JP] Japan .................................. 3-105836

[51] Int. Cl.⁶ ............................................. G06F 11/00
[52] U.S. Cl. .................................. 371/37.1; 371/37.7
[58] Field of Search ................... 371/37.1, 37.6, 37.7, 371/38.1, 39.1, 42

[56] References Cited

U.S. PATENT DOCUMENTS

| | | | |
|---|---|---|---|
| 4,397,020 | 8/1983 | Howson | 370/105 |
| 4,700,350 | 10/1987 | Douglas et al. | 371/37 |
| 5,230,002 | 7/1993 | Yamashita et al. | 371/37.1 |
| 5,271,001 | 12/1993 | Hadano | 370/15 |
| 5,274,633 | 12/1993 | Kato et al. | 370/60 |

Primary Examiner—Roy N. Envall, Jr.
Assistant Examiner—Cameron H. Tousi
Attorney, Agent, or Firm—Ostrolenk, Faber, Gerb & Soffen

[57] ABSTRACT

In a device controlled by an original control signal for correcting a header error in an original STM signal comprising first through P-th header blocks and an HEC (header error check) block, each header block comprising first through N-th ATM cell header units, the HEC block comprising first through N-th ATM cell HEC units, a delay circuit (49) produces a delayed STM signal (S') by giving the original STM signal (S) a delay equal to (P×N) times an interval of each of the header and the HEC units. Another delay circuit (51) produces a delayed control signal (C') by giving the original control signal (C) the delay. In accordance with an n-th check result produced by an error checking section (43, 45, 47) controlled by the original control signal to check the header error in the original STM signal, an error correcting section (53, 55, 59, 61) corrects the header error in connection with an n-th ATM cell header unit of a p-th header block of the delayed STM signal when the delayed control signal indicates the n-th ATM cell header unit of the p-th header block, where n and p are variable between 1 and N (both inclusive) and between 1 and P (both inclusive), respectively.

4 Claims, 4 Drawing Sheets

COMPACT DEVICE FOR CORRECTING A HEADER ERROR IN ATM CELLS

BACKGROUND OF THE INVENTION

This invention relates to a header error correcting device for correcting a header error in ATM (asynchronous transfer mode) cells used in an STM (synchronous transfer mode) signal.

The ATM cells are transmitted in a synchronous transfer mode as the STM signal. The synchronous transfer mode is used on various levels. When transmitted in the synchronous transfer mode of a level M, where M represents a prescribed natural number, the STM signal is called an STM-M signal. An STM-1 signal is transmitted at a bit rate of 155.52 Mbits/s and comprises 2,016 telephone channels. An STM-4 signal is transmitted at a higher bit rate of 622.08 Mbits/s and comprises 8,064 telephone channels. An STM-16 signal is transmitted at a still higher bit rate of 2,488.32 Mbits/s and comprises 32,256 telephone channels.

In order to monitor the ATM cells used in the STM signal, a header error check (HEC) device is generally used. Such a header error check device has a data input terminal for receiving the STM signal comprising a header part. The header error check device is for checking a header error in the header part. The header part comprises first through P-th header blocks and a header error check block, where P represents a first predetermined natural number. Each of the header blocks comprises first through N-th ATM cell header units, where N represents a second predetermined natural number. The header error check block comprises first through N-th ATM cell header error check units. The first ATM cell header units of the first through the P-th header blocks and the first ATM cell header error check unit constitute a header of a first ATM cell. Likewise, the N-th ATM cell header units of the first through the P-th header blocks and the N-th ATM cell header error check unit constitute a header of an N-th ATM cell. Each of the first through the N-th ATM cell header units and the first through the N-th ATM cell header error check units comprises a third predetermined natural number of bits at a predetermined bit interval.

Thus, the STM signal is a time division multiplexed signal of the first through the N-th ATM cells. The second predetermined natural number N represents multiplicity of the time division multiplexed signal.

The header error check device includes a control signal producing section, such as an SDH (synchronous digital hierarchy) terminator or terminating circuit, connected to the data input terminal for producing an original unit control signal. In a conventional header error check device, the original unit control signal comprises first through N-th control signals. An n-th control signal is for indicating successively the bits of an n-th ATM cell header unit in each of the header blocks and the bits of an n-th header error check unit, where n is variable between 1 and N, both inclusive.

In the conventional header error check device, an n-th cyclic redundancy check (CRC) circuit is controlled by the n-th control signal to carry out cyclic redundancy check on each n-th ATM cell header unit of the STM signal. The n-th cyclic redundancy check circuit thereby checks the header error in the n-th ATM cell header units of the header blocks.

It is now understood that the conventional header error check device comprises first through N-th cyclic redundancy check circuits. As a consequence, the conventional header error check device is bulky and expensive.

In order to obtain a compact header error check device, an improved header error check device is proposed in a prior U.S. patent application Ser. No. 821,691 which was filed Jan. 16, 1992, under the title of "Compact device for monitoring ATM cells", by Hiroshi Yamasita and Takashi Miyazono for assignment to the present assignee. The above-named Takashi Miyazono is the instant applicant. The Miyazono et al patent application corresponds to a prior Canadian patent application No. 2,059,396 which was filed Jan. 15, 1992 and was filed on the basis of Japanese Patent Application No. 14963/1991 and others.

The improved header error check device comprises a sole error checking section connected to the data input terminal and to the control signal producing section for checking the header error in connection with an n-th ATM cell header unit of a p-th header block and an n-th ATM cell header error check unit when the original unit control signal indicates the n-th ATM cell header unit of the p-th header block and the n-th ATM cell header error check unit, where n is variable between 1 and N, both inclusive, p being variable between 1 and P, both inclusive.

The improved header error check device can check the header error in the header part of the STM signal. However, the improved header error check device can not correct the header error in the first through the N-th ATM cell header units of the first through the P-th header blocks of the STM signal.

SUMMARY OF THE INVENTION

It is therefore an object of this invention to provide a header error correcting device for correcting a header error in first through N-th ATM cell header units of first through P-th header blocks of an STM signal, which device is compact.

It is another object of this invention to provide a header error correcting device of the type described, which device is inexpensive.

Other objects of this invention will become clear as the description proceeds.

On setting forth the gist of this invention, it is possible to understand that a header error correcting device has a data input terminal for receiving an original STM signal comprising a header part. The header part comprises first through P-th header blocks and a header error check block, where P represents a first predetermined natural number. Each of the header blocks comprises first through N-th ATM cell header units, where N represents a second predetermined natural number. The header error check block comprises first through N-th ATM cell header error check units. Each of the first through the N-th ATM cell header units and the first through the N-th ATM cell header error check units comprises a third predetermined natural number of bits at a predetermined bit interval. The header error correcting device is for correcting a header error in the first through the N-th ATM cell header units of the first through the P-th header blocks. The header error correcting device includes a control signal producing section connected to the data input terminal for producing an original unit control signal for indicating successively the first through the N-th ATM cell header units of the first through the P-th header blocks of the original STM signal and subsequently successively the first through the N-th ATM cell header error check units of the original STM signal.

According to this invention, the above-understood header error correcting device comprises: a sole error checking section connected to the data input terminal and the control signal producing section for checking the header error in connection with an n-th ATM cell header unit of a p-th header block of the original STM signal and an n-th ATM cell header error check unit of the original STM signal when the original unit control signal indicates the n-th ATM cell header unit of the p-th header block of the original STM signal and the n-th ATM cell header error check unit of the original STM signal, where n is variable between 1 and P, both inclusive, p being variable between 1 and P, both inclusive, the sole error checking section being for producing an n-th check result when the original unit control signal indicates the n-th ATM cell header error check unit of the original STM signal; a first delay circuit connected to the data input terminal for producing a delayed STM signal by giving the original STM signal a delay of a plurality of bit intervals, equal in number to (P×N) times the third predetermined natural number; a second delay circuit connected to the control signal producing section for producing a delayed unit control signal by giving the original unit control signal the delay; and a sole error correcting section connected to the sole error checking section and to the first and the second delay circuits for correcting, in accordance with the n-th check result, the header error in connection with the n-th ATM cell header unit of the p-th header block of the delayed STM signal when the delayed unit control signal indicates the n-th ATM cell header unit of the p-th header block of the delayed STM signal.

DESCRIPTION OF THE PREFERRED EMBODIMENTS

Figure 1:
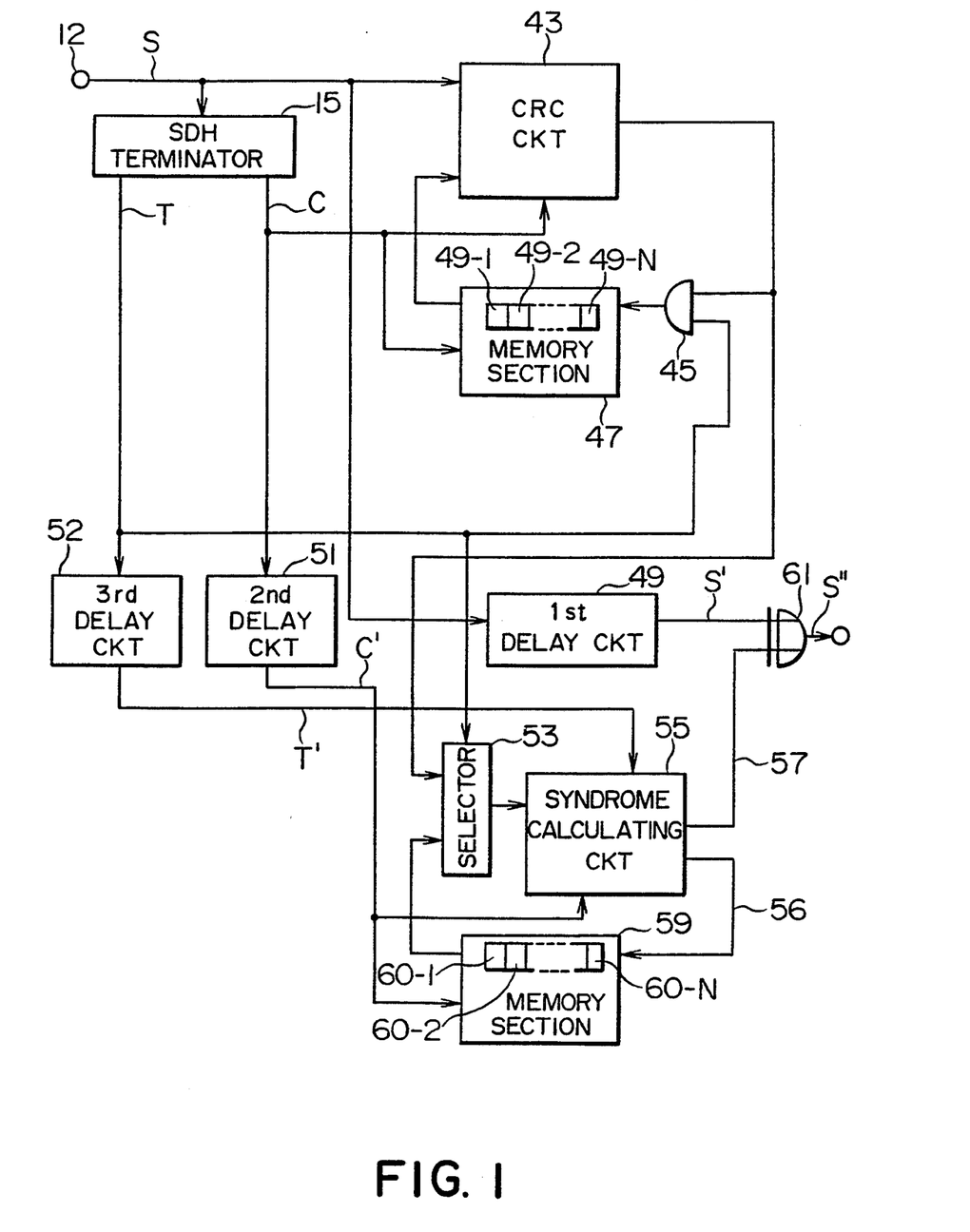
FIG. 1 is a block diagram of a header error correcting device according to an embodiment of this invention.

Referring to FIG. 1, a header error correcting device according to a preferred embodiment of this invention has a data input terminal 12 for receiving an original STM (synchronus transfer mode) signal S of a level M, where M represents a prescribed natural number. Examples of the level M are described heretobefore.

Figure 2:
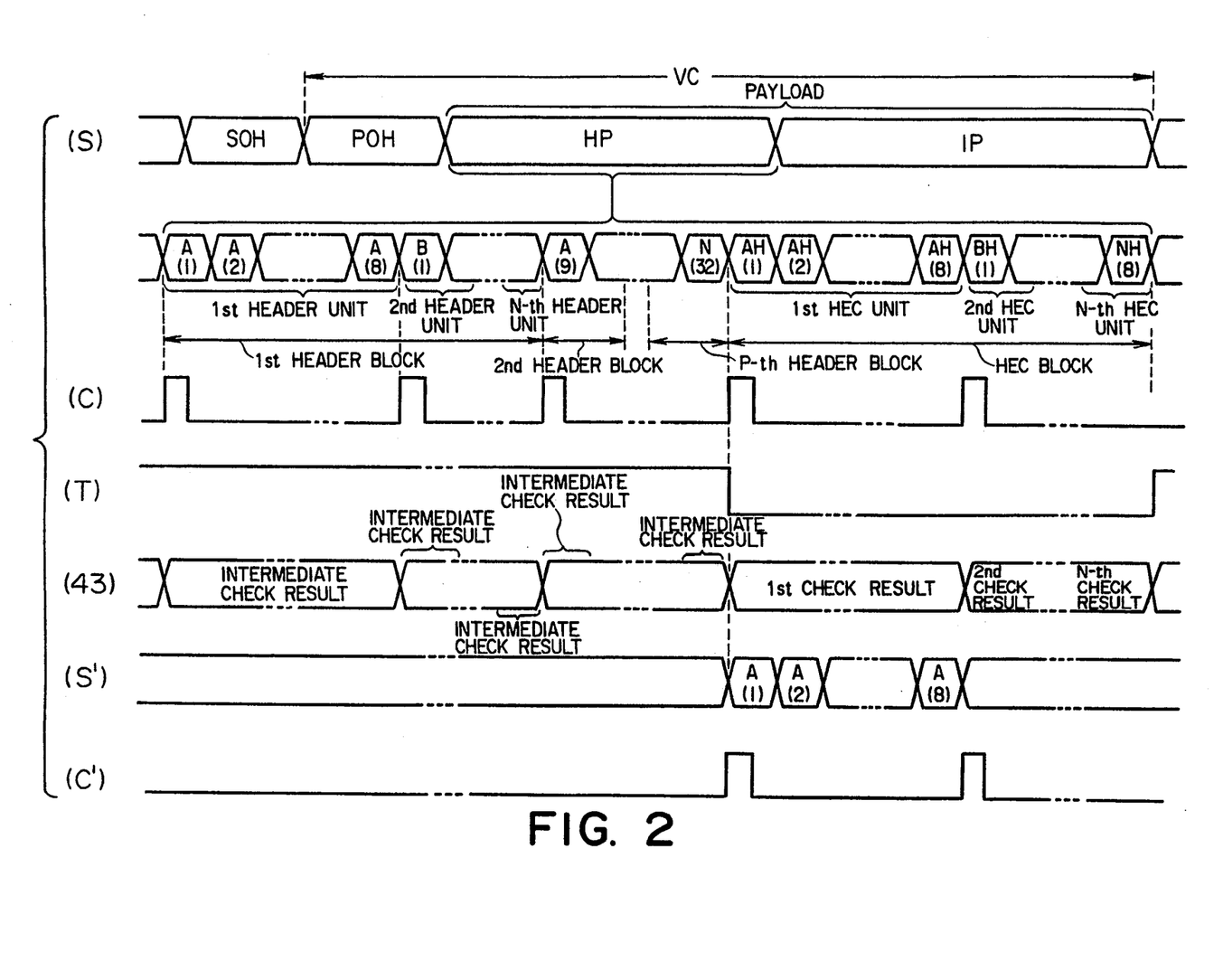
FIG. 2 is a time chart for use in describing operation of the device illustrated in FIG. 1.

Turning to FIG. 2, the original STM signal S comprises a section overhead SOH and a virtual container VC as depicted along a first line labelled (S). The section overhead SOH is known in the art. The virtual container VC comprises a path overhead POH and a payload which comprises a header part HP and an information part IP. The path overhead POH follows the section overhead SOH in the original STM signal S and is also known in the art. The header part HP follows the path overhead POH in the original STM signal S and is followed by the information part IP which comprises first through J-th information blocks (not herein shown), where J represents a prescribed positive integer. Each of the information blocks comprises first through N-th ATM information units (not shown).

As depicted along a second line in FIG. 2 in detail, the header part HP comprises first through P-th header blocks and a header error check (HEC) block, where P represents a first predetermined natural number. Each of the header blocks comprises first through N-th ATM (asynchronous transfer mode) cell header units, where N represents a second predetermined natural number. The first through the N-th ATM cell header units are indicated at "first through N-th header units" with names thereof compressed. The header error check block comprises first through N-th ATM cell header error check units which are indicated at "first through N-th HEC units" with names thereof abbreviated. Each of the first through the N-th ATM cell header units and the first through the N-th ATM cell header error check units comprises a third predetermined natural number Q of bits at a predetermined bit interval.

It will be assumed that the first predetermined natural number P is equal to four and that the second predetermined natural number N has not a specific value for the time being. In general, the third predetermined natural number Q is typically equal to eight. That is, each of the ATM cell header units and the ATM cell header error check units has a unit length (a header unit or header error check unit length) of one byte or eight bits.

More specifically, the bits of the first ATM cell header unit in the first header block are illustrated at A(1), A(2), ..., and A(8). In the second header block, the bits of the first ATM cell header unit are indicated by A(9), ..., and A(16). In this manner, the first ATM cell header units of the third through the fourth header blocks have the bits represented by A(17) and so forth. Similarly, the bits of the second ATM cell header units of the first header block are represented by B(1), ..., and B(8).

Supposing that the second predetermined natural number N is equal to four, the bits of the N-th ATM cell header unit of the P-th header block are indicated by N(25), ..., and N(32). The bits of the first ATM cell header error check unit are depicted at AH(1), AH(2), ..., and AH(8). The bits of the second ATM cell header error check unit are indicated at BH(1), ..., and BH(8). The bits of the N-th ATM cell header error check unit end at NH(8).

Figure 3:
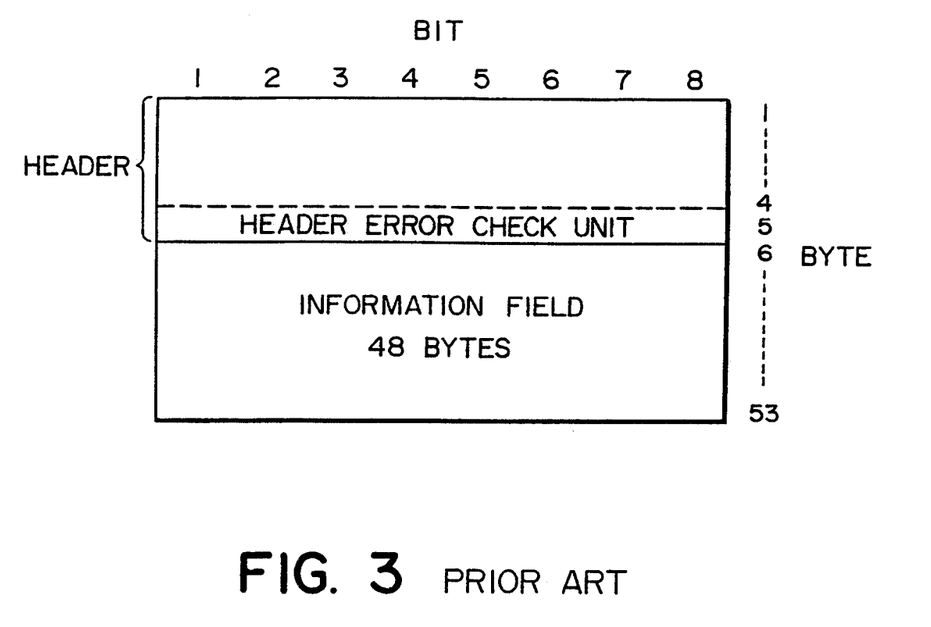
FIG. 3 is a diagram for use in describing a structure of an ATM cell in general.

Further turning to FIG. 3, one of first through N-th ATM cells comprises first through fifty-third bytes or octets in the manner indicated along the ordinate. As illustrated along the abscissa, each byte consists of first through eighth bits which are more in general first through Q-th bits. The illustrated ATM cell will be called an n-th ATM cell, where n is variable between 1 and N, both inclusive as described above.

The first through the fifth bytes are collectively called a header of the n-th ATM cell and the sixth through the fifty-third bytes, an information of the n-th ATM cell. In the illustrated information field, the prescribed positive integer J is equal to forty-eight.

FIG. 2 will additionally be referred to. The first through the fourth bytes are representative of n-th ATM cell header units in first through fourth header blocks or more in general, the first through the P-th header blocks. In other words, an n-th ATM cell header unit is depicted as a p-th byte, where p is variable between 1 and P, both inclusive. More particularly, a p-th header block consists of the first through the N-th ATM cell header units at the p-th bytes of the first through the N-th ATM cells. In the example being illustrated, the fifth byte is the n-th ATM cell header error check unit. It is now understood that the header part HP comprises the headers of the first through the N-th ATM cells.

In FIG. 2, attention will be directed to n-th ATM cell header units of the first through the P-th header blocks. It is possible to refer to such ATM cell header units as (1, n)-th, (2, n)-th, ..., and (P, n)-th ATM cell header units. In a p-th block of the first through the P-th header blocks, the n-th ATM cell header unit is called a (p, n)-th ATM cell header unit.

Turning back to FIG. 1 with reference to FIG. 2 continued, the header error correcting device is for correcting a header error in the first through the N-th ATM cell header units of the first through the P-th header blocks of the header part HP and comprises an SDH (synchronous digital hierarchy) terminator or terminating circuit 15 connected to the data input terminal 12. In response to the section overhead SOH and the path overhead POH, the SDH terminator 15 produces an original unit control signal C and a unit selection signal T. In the manner exemplified along a third line labelled (C) by pulses, the original unit control signal C indicates successively the first through the N-th ATM cell header units of the first through the P-th header blocks of the original STM signal S and subsequently successively the first through the N-th ATM cell header error check units of the original STM signal S. As exemplified along a fourth line labelled (T), the unit selection signal successively indicates the first through the N-th ATM cell header error check units by a logic zero level.

In the header error correcting device being illustrated, a single cyclic redundancy check (CRC) circuit 43 is connected to the data input terminal 12 and to the SDH terminator 15. The cyclic redundancy check circuit 43 carries out cyclic redundancy check, when the original unit control signal C indicates successively the n-th ATM cell header units of the first through the P-th header blocks of the original STM signal S as (p, n)-th ATM cell header units of the original STM signal S, on the (p, n)-th ATM cell header units of the original STM signal S and (p, n)-th previous check result signals. The cyclic redundancy check circuit 43 produces intermediate check results of the cyclic redundancy check as (p, n)-th intermediate check result signals in the manner exemplified along a fifth line labelled (43).

An AND gate 45 is supplied with the (p, n)-th intermediate check result signal from the cyclic redundancy check circuit 43. Supplied additionally with the original unit selection signal T from the SDH terminator 15, the AND gate 45 allows the (p, n)-th intermediate result signal to pass therethrough insofar as the original unit selection signal T is given a high level depicted in FIG. 2 along the fourth line (T).

A memory section 47 is supplied with the (p, n)-th intermediate result signal from the AND gate 45 and comprises an RAM (random access memory) having first through N-th memory cells which are symbolically depicted at 49-1, 49-2, ..., and 49-N. The memory section 47 further comprises an access circuit (not shown) to access to the RAM in response to the original unit control signal C. The first through the N-th memory cells 49-1 to 49-N are accessible when the original unit control signal C indicates successively the (p, n)-th ATM cell header units of the original STM signal S. When the original unit control signal indicates the (p, n)-th ATM cell header unit to access to an n-th memory cell 49-n, the (p, n)-th intermediate check result signal is stored in the n-th memory cell 49-n as a (p, n)-th memorized check result signal. The memory section 47 supplies the cyclic redundancy check circuit 43 with a (p-1, n)-th memorized check result signal from the n-th memory cell 49-n as the (p, n)-th previous check result signal. The memory section 47 supplies the cyclic redundancy circuit 43 with a (P, n)-th memorized check result signal when the original unit control signal C indicates the n-th ATM cell header error check unit of the original STM signal S.

It is now understood in connection with FIGS. 1 and 2 that a combination of the AND gate 45 and the memory section 47 serves as a check result memory section connected to the cyclic redundancy check circuit 43 and controlled by the original unit control signal C. When the original unit control signal C indicates successively the (p, n)-th ATM cell header units of the original STM signal S, the check result memory section (45, 47) memorizes the (p, n)-th intermediate check result signals as the (p, n)-th memorized check result signals and supplies the cyclic redundancy check circuit 43 with the (p-1, n)-th memorized result signals as the (p, n)-th previous check result signals. When the original unit control signal C indicates the n-th ATM cell header error check unit of the original STM signal S, the check result memory section (45, 47) supplies the cyclic redundancy check circuit 43 with the (P, n)-th memorized check result signal.

Figure 4:
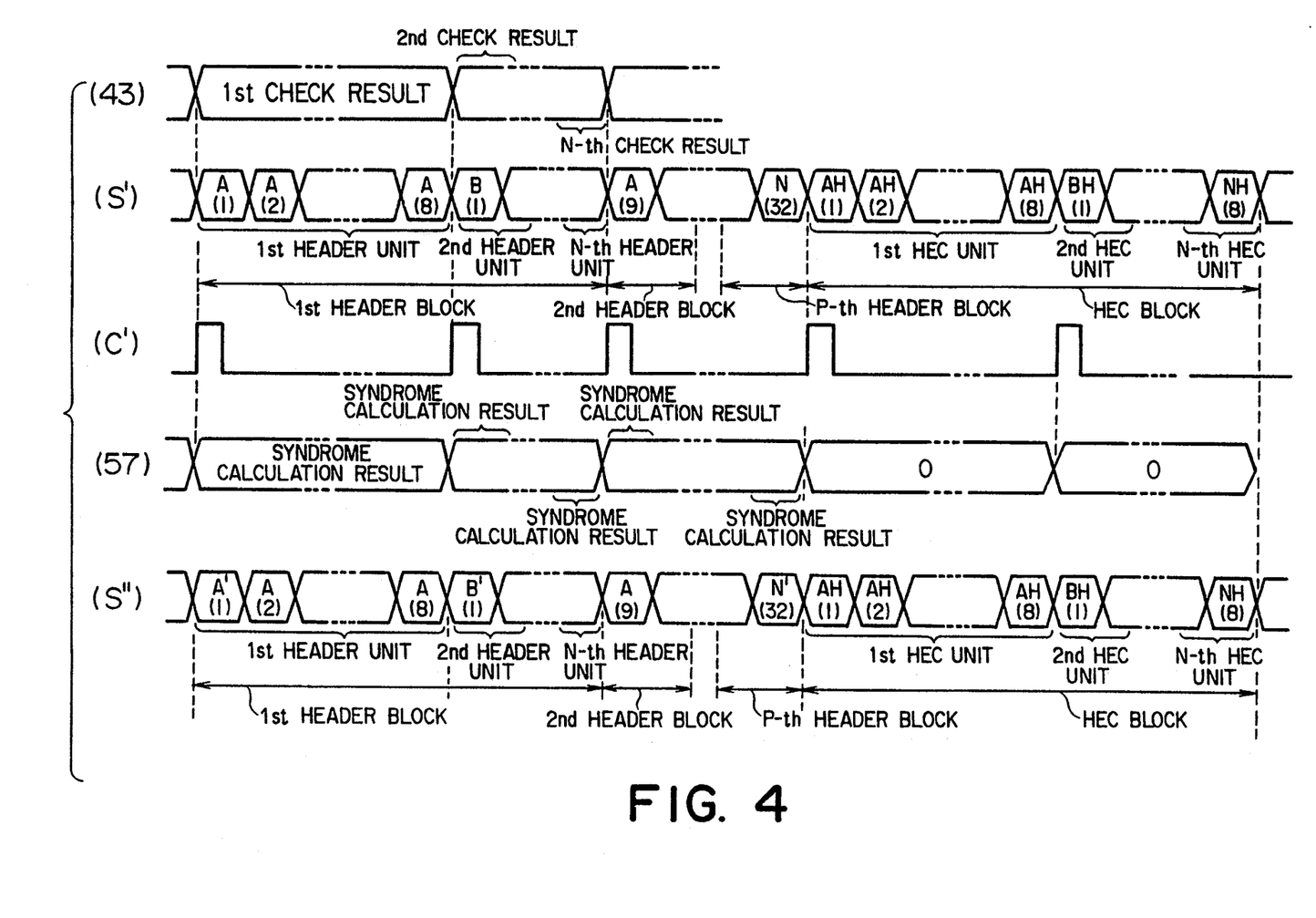
FIG. 4 is another time chart for use in describing operation of the device illustrated in FIG. 1.

The cyclic redundancy check circuit 43 carries out the cyclic redundancy check, when the original unit control signal C indicates the n-th ATM cell header error check unit of the original STM signal S, on the n-th ATM cell header error check unit and the (P, n)-th memorized check result signal. The cyclic redundancy check circuit 43 thereby produces an n-th check result of the cyclic redundancy check. That is, the cyclic redundancy check circuit 43 produces first through N-th check results in the manner exemplified along the fifth line labelled (43). The first through the N-th check results are also illustrated in FIG. 4 along a first line labelled (43).

At this moment, the original unit selection signal T has a low level on indicating the n-th ATM cell header error check unit. In this case, the AND gate 45 produces a logic "0" level signal to make the n-th memory cell 49-n memorize the logic "0" level signal as an n-th memorized signal which is used as the (1, n)-th previous check result signal when the cyclic redundancy check circuit 43 processes a following header part following the illustrated header part HP in FIG. 2.

The n-th check result typically represents a residue given by dividing the n-th ATM cell header units of the first through the P-th header blocks and the n-th ATM cell header error check unit by a generation polynomial. The residue represented by the n-th check result is equal to zero when the header error is not found.

Briefly stated with reference to FIGS. 1 and 2, the SDH terminator 15 serves as a control signal producing section. Connected to the data input terminal 12, the control signal producing section produces the unit control signal C.

Reviewing FIGS. 1, 2, and 4, a combination of the single cyclic redundancy check circuit 43 and the check result memory section (45, 47) serves as a sole error checking section. Connected to the data input terminal 12 and to the control signal producing section (15), the sole error checking section (43, 45, 47) checks the header error in connection with the n-th ATM cell header unit of the p-th header block of the original STM signal S and the n-th ATM cell header error check unit of the original STM signal S when the original unit control signal C indicates the n-th ATM cell header unit of the p-th header block of the original STM signal S and subsequently the n-th ATM cell header error check unit of the original STM signal.

Referring more particularly to FIGS. 1, 2, and 4, the header error correcting device comprises a first delay circuit 49 connected to the data input terminal 12. The first delay circuit 49 produces a delayed STM signal S' by giving the original STM signal S a delay of a plurality of bit intervals, equal in number to (P×N) times the third predetermined natural number. The delayed STM signal S' is depicted in FIG. 2 along a sixth line labelled (S') and in FIG. 4 along a second line (S'). A second delay circuit 51 is connected to the SDH terminator 15 for producing a delayed unit control signal C' by giving the delay to the original unit control signal C. The delayed unit control signal C' is illustrated in FIG. 2 along a seventh line and in FIG. 4 along a third line labelled (C'). Likewise, a third delay circuit 53 produces a delayed unit selection signal T' by giving the delay to the original unit selection signal T.

A single selector or switch 53 is controlled by the original unit selection signal T and has a first selector input terminal connected to the cyclic redundancy check circuit 43 and a second selector input terminal supplied with a selector input signal. The selector 53 successively selects the first through the N-th check results as a selected signal when the original unit selection signal T successively indicates the first through the N-th ATM cell header error check units of the original STM signal S. The selector 53 selects the selector input signal as the selected signal when the original unit selection signal C does not indicate the first through the N-th ATM cell header error check units of the original STM signal S.

In FIGS. 1 and 4, a single syndrome calculating circuit 55 is connected to the selector 53 and to the second and the third delay circuits 51 and 52. The syndrome calculating circuit 55 is supplied with the first through the N-th check results from the selector 53 as the selected signal when the original unit selection signal T successively indicates the first through the N-th ATM cell header error check units of the original STM signal S. When the original unit selection signal does not indicate the first through the N-th ATM cell header error check units of the original STM signal S, the syndrome calculating circuit 55 is supplied with the selector input signal from the selector 53 as the selected signal. The syndrome calculating circuit 55 carries out syndrome calculation on the selected signal when the delayed unit control signal C' indicates successively the n-th ATM cell header unit of the first through the P-th header blocks of the delayed STM signal S' as the (p, n)-th ATM cell header units of the delayed STM signal S'. The syndrome calculating circuit 55 produces intermediate calculation results of the syndrome calculation as (p, n)-th intermediate calculation result signals 56 and produces syndrome calculation results of the syndrome calculation as (p, n)-th syndrome calculation result signals 57. The (p, n) syndrome calculation result signals 57 are illustrated in FIG. 4 along a fourth line labelled (57).

A calculation result memory section 59 is supplied with the (p, n)-th intermediate calculation result signals 56 from the syndrome calculating circuit 55 and is controlled by the delayed unit control signal C'. Like the memory section 47, the calculation result memory section 59 comprises an RAM having first through N-th memory cells 60-1, 60-2, . . . , and 60-N and further comprises an access circuit (not shown) to access to the RAM in response to the delayed unit control signal C'. The calculation result memory 59 carries out operation similar to that of the memory section 47. The first through the N-th memory cells 60-1 to 60-N are accessible when the delayed unit control signal C' indicates successively the (p, n)-th ATM cell header units of the delayed STM signal S'. When the delayed unit control signal indicates the (p, n)-th ATM cell header unit to access to an n-th memory cell 60-n, the (p, n)-th intermediate calculation result signal is stored in the n-th memory cell 60-n as a (p, n)-th memorized calculation result signal. The calculation result memory section 59 supplies the selector 53 with a (p-1, n)-th memorized calculation result signal from the n-th memory cell 60-n as the selector input signal.

Thus, the calculation result memory section 59 is for memorizing, when the delayed unit control signal C' indicates successively the (p, n)-th ATM cell header units of the delayed STM signal S', the (p, n)-th intermediate calculation result signals 56 as (p, n)-th memorized calculation result signals and for supplying the selector 53 with (p-1, n)-th memorized calculation result signals as the input selector signal.

A single exclusive OR circuit 61 is connected to the first delay circuit 49 and to the syndrome calculating circuit 55 carries out exclusive OR calculation on the (p, n)-th ATM cell header units of the delayed STM signal S' and the syndrome calculation results of the (p, n)-th syndrome calculation result signals 57. The exclusive OR circuit 61 produces an exclusive OR'ed signal S'' in which the header error is corrected in the first through the N-th ATM cell header units of the first through the P-th header blocks of the delayed STM signal S' in accordance with the first through the N-th check results produced by the cyclic redundancy check circuit 43.

In FIG. 4, the exclusive OR'ed signal S'' is illustrated along a fifth line labelled (S''). In the illustrated exclusive OR'ed signal (S''), the bits A'(1), B'(2), and N'(32) represent corrected bits. Remaining bits are identical with corresponding bits of the delayed STM signal S' illustrated along the second line labelled (S'). As is apparent from the above, each of the syndrome calculation results of the calculation result signals 57 illustrated along the fourth line (57) specifies, by a logic "1" level, a bit location of the header error found in the header part HP by the cyclic redundancy check circuit 43. In a case where the header error is not found, the syndrome calculation result in question has a logic "0" level.

In FIGS. 1 and 4, such syndrome calculation results are produced by the syndrome calculating circuit 55. It should be noted here that the syndrome calculating circuit 55 supplies a logic "0" level signal (see the fourth line (57) of FIG. 4) to the exclusive OR circuit 61 when the delayed unit selection signal T' indicates the first through the N-th ATM cell header error check units of the delayed STM signal S'. As a result, the exclusive OR circuit 61 produces the first through the N-th ATM cell header error check units of the STM signal S' as they are in the manner shown in FIG. 4 along the second and the fifth lines (C') and (S''). Thus, the header error correcting device of FIG. 1 corrects the header error in the first and the N-th ATM cell header units of the first through the P-th header blocks of the header part.

In FIG. 1, a combination of the selector 53, the syndrome calculating circuit 55, the calculation result memory section 59, and the exclusive OR circuit 61 serves as a sole error correcting section connected to the sole error checking section (43, 45, 47) and to the first and the second delay circuits 49 and 51. The sole error correcting section (53, 55, 59, 61) corrects, in accordance with the n-th check result, the header error in connection with the n-th ATM cell header unit of the p-th header block of the delayed STM signal when the delayed unit control signal C' indicates the n-th ATM cell header unit of the p-th header block of the delayed STM signal S'.

What is claimed is:

1. A header error correcting device which has a data input terminal for receiving an original STM signal comprising a header part, said header part comprising first through P-th header blocks and a header error check block, where P represents a first predetermined natural number, each of said header blocks comprising first through N-th ATM cell header units, where N represents a second predetermined natural number, said header error check block comprising first through N-th ATM cell header error check units, each of said first through said N-th ATM cell header units and said first through said N-th ATM cell header error check units comprising a third predetermined natural number of bits at a predetermined bit interval, said header error correcting device being for correcting a header error in the first through the N-th ATM cell header units of said first through said P-th header blocks, said header error correcting device including a control signal producing section connected to said data input terminal for producing an original unit control signal for indicating successively the first through the N-th ATM cell header units of the first through the P-th header blocks of said original STM signal and subsequently successively the first through the N-th ATM cell header error check units of said original STM signal, said header error correcting device comprising:

a sole error checking section connected to said data input terminal and said control signal producing section for checking said header error in connection with an n-th ATM cell header unit of a p-th header block of said original STM signal and an n-th ATM cell header error check unit of said original STM signal when said original unit control signal indicates the n-th ATM cell header unit of the p-th header block of said original STM signal and the n-th ATM cell header error check unit of said original STM signal, where n is variable between 1 and N, both inclusive, p being variable between 1 and P, both inclusive, said sole error checking section being for producing an n-th check result when said original unit control signal indicates the n-th ATM cell header error check unit of said original STM signal;

a first delay circuit connected to said data input terminal for producing a delayed STM signal by giving said original STM signal a delay of a plurality of bit intervals, equal in number to (P×N) times said third predetermined natural number;

a second delay circuit connected to said control signal producing section for producing a delayed unit control signal by giving said original unit control signal said delay; and a sole error correcting section connected to said sole error checking section and to said first and said second delay circuits for correcting, in accordance with said n-th check result, said header error in connection with the n-th ATM cell header unit of the p-th header block of said delayed STM signal when said delayed unit control signal indicates the n-th ATM cell header unit of the p-th header block of said delayed STM signal.

2. A header error correcting device as claimed in claim 1, wherein said sole error checking section comprises:

a single cyclic redundancy check circuit connected to said data input terminal and to said control signal producing section for carrying out cyclic redundancy check, when said original unit control signal indicates successively the n-th ATM cell header units of the first through the P-th header blocks of said original STM signal as (p, n)-th ATM cell header units of said original STM signal, on the (p, n)-th ATM cell header units of said original STM signal and (p, n)-th previous check result signals, said cyclic redundancy check circuit being for producing intermediate check results of said cyclic redundancy check as (p, n)-th intermediate check result signals; and a check result memory section connected to said cyclic redundancy check circuit and controlled by said original unit control signal for memorizing, when said original unit control signal indicates successively the (p, n)-th ATM cell header units of said original STM signal, said (p, n)-th intermediate check result signals as (p, n)-th memorized check result signals and for supplying said cyclic redundancy check circuit with (p-1, n)-th memorized check result signals as said (p, n)-th previous check result signals, said check result memory section being for supplying said cyclic redundancy check circuit with a (P, n)-th memorized check result signal when said original unit control signal indicates the n-th ATM cell header error check unit of said original STM signal;

said cyclic redundancy check circuit being for carrying out said cyclic redundancy check, when said original unit control signal indicates the n-th ATM cell header error check unit of said original STM signal, on the n-th ATM cell header error check unit and said (P, n)-th memorized check result signal, said cyclic redundancy check circuit being for producing first through N-th check results of said cyclic redundancy check as said n-th check result.

3. A header error correcting device as claimed in claim 2, said control signal producing section being for additionally producing an original unit selection signal for successively indicating the first through the N-th ATM cell header units of said original STM signal, wherein said sole error correcting section comprises:

a single selector controlled by said original unit selection signal and having a first selector input terminal connected to said cyclic redundancy check circuit and a second selector input terminal supplied with a selector input signal, said selector being for successively selecting said first through said N-th check results as a selected signal when said original unit selection signal successively indicates the first through the N-th ATM cell header error check units of said original STM signal, said selector being for selecting said selector input signal as said selected signal when said original unit selection signal does not indicate the first through the N-th ATM cell header error check units of said original STM signal;

a single syndrome calculating circuit connected to said selector and to said second delay circuit for carrying out syndrome calculation on said selected signal when said delayed unit control signal indicates successively the n-th ATM cell header units of the first through the P-th header blocks of sid delayed STM signal as the (p, n)-th ATM cell header units of said delayed STM signal, said syndrome calculating circuit being for producing intermediate calculation results of said syndrome calculation as (p, n)-th intermediate calculation result signals and for producing syndrome calculation results of said syndrome calculation as (p, n)-th syndrome calculation result signals;

a calculation result memory section connected to said syndrome calculating circuit and controlled by said delayed unit control signal for memorizing, when said delayed unit control signal indicates successively the (p, n)-th ATM cell header units of said delayed STM signal, the (p, n)-th intermediate calculation result signals as (p, n)-th memorized calculation result signals and for supplying said selector with (p-1, n)-th memorized calculation result signals as said input selector signal; and a single exclusive OR circuit connected to said first delay circuit and to said syndrome calculating circuit for carrying out exclusive OR calculation on the (p, n)-th ATM cell header units of said delayed STM signal and said syndrome calculation results of said (p, n)-th syndrome calculation result signals, said exclusive OR circuit being for producing an exclusive OR'ed signal in which said header error is corrected in the first through the N-th ATM cell header units of the first through the P-th header blocks of said delayed STM signal in accordance with said first through said N-th check results produced by said cyclic redundancy check circuit.

4. A header error correcting device as claimed in claim 3, wherein:

said header error correcting device further comprises a third delay circuit connected to said control signal producing section for producing a delayed unit selection signal by giving said original unit selection signal said delay;

said syndrome calculating circuit being connected to said third delay circuit for supplying a logic "0" level signal to said exclusive OR circuit when said delayed unit selection signal indicates the first through the N-th ATM cell header error check units of said delayed STM signal.

* * * * *